(12) United States Patent
Umeki

(10) Patent No.: US 7,199,510 B2
(45) Date of Patent: Apr. 3, 2007

(54) QUARTZ CRYSTAL UNIT

(75) Inventor: Mitoshi Umeki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 132 days.

(21) Appl. No.: 11/170,024

(22) Filed: Jun. 29, 2005

(65) Prior Publication Data
US 2006/0001333 A1 Jan. 5, 2006

(30) Foreign Application Priority Data
Jul. 1, 2004 (JP) .............................. 2004-195287

(51) Int. Cl.
*H01L 41/08* (2006.01)

(52) U.S. Cl. ...................... 310/365; 310/367; 310/368; 310/320

(58) Field of Classification Search ................ 310/365, 310/368, 369, 320
See application file for complete search history.

(56) References Cited

U.S. PATENT DOCUMENTS

| | | | | |
|---|---|---|---|---|
| 3,382,381 | A | * | 5/1968 | Horton ........................ 310/320 |
| 3,872,411 | A | * | 3/1975 | Watanabe et al. ........... 333/187 |
| 4,656,707 | A | * | 4/1987 | Berte et al. ................. 29/25.35 |
| 6,232,699 | B1 | * | 5/2001 | Wajima ....................... 310/320 |
| 6,525,449 | B1 | * | 2/2003 | Wajima ....................... 310/365 |
| 2005/0110369 | A1 | * | 5/2005 | Onishi et al. ................ 310/320 |

FOREIGN PATENT DOCUMENTS

| | | |
|---|---|---|
| JP | 2004-040693 A | 2/2004 |
| JP | 2004-072676 A | 3/2004 |

* cited by examiner

*Primary Examiner*—Thomas M. Dougherty
(74) *Attorney, Agent, or Firm*—Knobbe Martens Olson & Bear, LLP

(57) ABSTRACT

A crystal unit for high frequency use includes: a crystal blank having a central portion that is used as a vibration region and a peripheral portion that surrounds the central portion and that is provided with a greater thickness than the central portion; a pair of excitation electrodes provided respectively on both major surface of the crystal blank in said vibration region; a pair of extending electrodes led out from the pair of excitation electrodes toward ends of the crystal blank, respectively; and an opposition region in which the extending electrodes overlap each other with the crystal blank interposed. Each of the extending electrodes connects to a corresponding excitation electrode over at least half of the outer circumference of the excitation electrode, and the thickness of the crystal blank is greater in the opposition region than in the vibration region.

7 Claims, 3 Drawing Sheets

QUARTZ CRYSTAL UNIT

BACKGROUND OF THE INVENTION

1. Field of the Invention

The present invention relates to a quartz crystal unit that is configured with a quartz crystal blank incorporated inside a receptacle, and more particularly to a crystal unit for high-frequency use in which the thickness of the crystal blank in the vibration region is reduced from the thickness in the outer periphery.

2. Description of the Background Art

Crystal units that are configured with crystal blanks housed inside receptacles are well known as frequency control elements, and are incorporated in the oscillation circuits of various electronic apparatuses as reference sources of frequency and time. In a crystal unit that employs an AT-cut quartz crystal blank, which is a representative quartz crystal blank, the resonance frequency is inversely proportional to the thickness of the crystal blank.

As optical communications have come into widespread use in recent years, great quantities of crystal units are being incorporated in optical communication systems, and this application has encouraged a trend toward crystal units with higher oscillation frequencies. To meet the need for higher oscillation frequencies, crystal units are being developed in which a depression is provided in the vibration region of the crystal blank to reduce the thickness of the crystal blank in this depression, whereby the oscillation frequency is raised, and moreover, the vibration region is held and the mechanical strength maintained by the relatively thick portions around the periphery of the depression. As an example, Japanese Patent Laid-Open Publication No. 2004-72676 (JP, P2004-72676A) discloses a crystal unit in which a portion of the crystal blank is removed by etching to reduce the thickness, the area in which thickness has been reduced serving as the vibration region.

FIG. 1A is a plan view of a crystal blank that is used in a crystal unit of the prior art, FIG. 1B is a sectional view of this crystal blank, and FIG. 1C is a sectional view of the crystal unit that incorporates this type of crystal blank.

The crystal unit is provided with, for example, rectangular crystal blank 1, which is an AT-cut quartz crystal blank. Crystal blank 1 has a thin central portion that is circular vibration region 1a and a thicker peripheral portion that encloses the outer circumference of vibration region 1a. In other words, a cylindrical depression is formed in one major surface of crystal blank 1, and the bottom of this depression is vibration region 1a. A pair of mutually opposed excitation electrodes 2a and 2b is formed on the both major surfaces of the crystal blank in this vibration region 1a. Excitation electrodes 2a and 2b are formed separated from positions that contact the inner walls of the depression for forming vibration region 1a, and are formed such that the overall area of vibration region 1a is sufficiently large compared to the areas of the excitation electrodes. Extending electrodes 3a and 3b are formed to extend from the pair of excitation electrodes 2a and 2b toward two end portions on opposite sides of the crystal blank. Extending electrodes 3a and 3b are formed on both major surfaces of crystal blank 1, respectively. Extending electrode 3a, which is formed on the major surface in which the depression of the crystal blank is formed, is formed folded back over the other major surface of the opposite side at the end portion of the crystal blank.

This crystal blank is fabricated by lithographic processes and etching processes, and a plurality of crystal blanks 1 is fabricated from a single crystal wafer (not shown in the figure). As shown in FIG. 1C, crystal unit 1 is held in receptacle 4 by securing the both ends of crystal blank at which extending electrodes 3a and 3b are extended on the inside bottom surface of surface-mounting receptacle 4 by conductive adhesive 7. A pair of internal terminals for electrically connecting to extending electrodes 3a and 3b are provided on the inside bottom surface of receptacle 4, and these internal terminals extend to mounting terminals 6 on the outer surface of receptacle 4. Cover 5 closes the opening of receptacle 4 that accommodates crystal blank 1, whereby crystal blank 1 is hermetically sealed inside receptacle 4. This completes the configuration of a crystal unit for surface mounting.

If the oscillation frequency in the fundamental wave of a crystal unit is to be 622 MHz, the thickness of the crystal blank in vibration region 1a is made approximately 2.2 μm. In addition, in response to demand for miniaturization of the overall crystal unit, the outer planar dimensions of crystal blank 1 are, for example, 1.4 mm×1.2 mm; and vibration region 1a is formed as a circle having a diameter of 0.5 mm. Each of excitation electrodes 2a and 2b is formed as, for example, a circle having a diameter of 0.2 mm that is positioned at the center of vibration region 1a.

However, in a crystal unit having the above-described configuration, the problem arises that the crystal Impedance (CI) basically increases due to the decrease in the outside dimensions of the crystal blank that is imposed by the miniaturization of the crystal unit. For example, decrease in the size of excitation electrodes 2a and 2b causes a reduction of the length of the electrically connected regions, i.e., the connection length, between excitation electrodes 2a and 2b and extending electrodes 3a and 3b. In this case, the connection length is the length of the portions in which excitation electrodes and extending electrodes are in contact in the direction that is orthogonal to the direction in which excitation electrodes and extending electrodes are joined, i.e., the direction of flow of a high-frequency current. When the connection length is small, the electrical conductive resistance between the excitation electrodes and the extending electrodes is great, and sufficient electrical energy therefore cannot be supplied from extending electrodes 3a and 3b to excitation electrodes 2a and 2b. In addition, the widths of extending electrodes 3a and 3b also become smaller, and this factor also contributes to an increase in the conductive resistance. Such factors that cause an increase in the conductive resistance in turn cause the crystal impedance of the crystal unit to increase. Typically, when the crystal impedance in a crystal unit is great, the oscillation characteristics deteriorate.

However, in the above-described crystal unit that is disclosed in JP, P2004-72676A, circular excitation electrodes 2a and 2b are used, and the corresponding extending electrodes are each led out with approximately half of the periphery on mutually opposite sides of circular excitation electrodes 2a and 2b as the connection regions, as shown in FIGS. 2A and 2B, and the connection length between the excitation electrodes and extending electrodes is thus increased and the conductive resistance decreased. Extending electrodes 3a and 3b are formed so as to spread out fan-like on mutually opposite sides with the excitation electrodes as center. The width and thickness of extending electrodes 3a and 3b are also increased to further reduce the conductive resistance. By adopting this configuration, the crystal impedance in the crystal unit shown in FIGS. 2A and 2B can be reduced to a low level.

According to another conceivable configuration for further reducing the crystal impedance, each of extending electrodes 3a and 3b is connected by the entire periphery of excitation electrodes 2a and 2b to increase the connection length between extending electrodes 3a and 3b and excitation electrodes 2a and 2b. In this way, electrical energy is supplied to excitation electrodes 2a and 2b from the entire periphery of the excitation electrodes. However, when extending electrodes are connected to excitation electrodes around the entire periphery in this way, the pair of extending electrodes 3a and 3b overlap each other with the crystal blank interposed, giving rise to problems that are described below.

FIG. 3 shows an equivalent circuit diagram of a crystal unit. The equivalent circuit of a typical crystal unit is represented as a configuration in which equivalent parallel capacitance C0 is parallel-connected to the serial connection of: equivalent series inductance L, equivalent series capacitance C1, and equivalent series resistance R. In addition, the ratio of equivalent parallel capacitance C0 to equivalent series capacitance C1 is referred to as "capacitance ratio γ." In an oscillation circuit that uses a crystal unit, the variable width of frequencies typically increases as capacitance ratio γ decreases, and the configuration and adjustment of the oscillation circuit is therefore facilitated. The crystal unit is therefore normally designed such that capacitance ratio γ is small.

When the pair of extending electrodes 3a and 3b overlap each other with the crystal blank interposed, excitation electrodes 2a and 2b become substantially larger, and the equivalent parallel capacitance C0 that is chiefly caused by inter-electrode capacitance therefore increases, causing capacitance ratio γ to increase. Equivalent parallel capacitance (inter-electrode capacitance) C0 and equivalent series capacitance C1 both increase in proportion to the opposition area of excitation electrodes 2a and 2b, but the increase of equivalent series capacitance C1 is limited. When the connection of extending electrodes 3a and 3b to the entire outer circumferences of excitation electrodes 2a and 2b essentially increases the sizes of excitation electrodes 2a and 2b, equivalent series capacitance C1 is saturated and equivalent parallel capacitance C0 still increases, ultimately causing capacitance ratio γ to increase.

If capacitance ratio γ of an appropriate range is to be obtained, the connection length between each excitation electrode and the corresponding extending electrode must be limited to up to half of the outer circumference of the excitation electrode, and this imposes limits on the increase of the connection length and the reduction of the crystal impedance.

SUMMARY OF THE INVENTION

It is an object of the present invention to provide a crystal unit for high-frequency use that has excellent oscillation characteristics and that allows increase of the connection regions or the connection length between excitation electrodes and extending electrodes while maintaining capacitance ratio γ at a low level to reduce crystal impedance.

The object of the present invention is achieved by a crystal unit that includes: a crystal blank having a central portion that is used as a vibration region and a peripheral portion that encloses the central portion and that is provided with greater thickness than the central portion; a pair of excitation electrodes provided respectively on both major surface of the crystal blank to oppose each other in the vibration region; a pair of extending electrodes led out from the pair of excitation electrodes toward the ends of the crystal blank; and an opposition region in which the pair of extending electrodes overlap each other with the crystal blank interposed; wherein each extending electrode connects to a corresponding excitation electrode over at least one half of the outer circumference of the excitation electrode; and the thickness of the crystal blank in the opposition region is greater than the thickness of the crystal blank in the vibration region.

In the crystal unit of the present invention, the extending electrodes connect over at least one half of the outer circumference of the excitation electrodes in the crystal blank, whereby the conductive resistance between the extending electrodes and excitation electrodes can be reduced to a low level, and further, electrical energy can be supplied to the excitation electrodes from at least one half of the outer circumference. According to the present invention, the crystal impedance of a crystal unit can be reduced to a low level.

In the present invention, a region exists in which the extending electrodes formed on the both major surfaces of crystal blank overlap with the crystal blank interposed, and in this opposition region, the thickness of the crystal blank is made greater than in the vibration region, with the result that, to the extent of the thickness of the crystal blank, a great reduction of the inter-electrode capacitance that is produced by the mutual opposition of the extending electrodes can be obtained. In the crystal unit of the present invention, equivalent parallel capacitance C0 can therefore be kept at a low level depending on the area of opposition of the excitation electrodes in the thick portion, i.e., the opposition region; and because the equivalent series capacitance C1 can be kept substantially uniform and the area of the excitation electrodes can be kept uniform with respect to the oscillation frequency, the capacitance ratio γ (=C0/C1) can be reduced to a low level.

The extending electrodes are in mutual opposition in the opposition region, but the oscillation frequency that is produced by the mutual opposition of the extending electrodes with the crystal blank interposed is generated at a lower range than the oscillation frequency that is produced by the excitation electrodes in the vibration region because the thickness is greater in the opposition region than in the vibration region. The oscillation frequency that is produced by the opposition of the extending electrodes therefore has no appreciable effect upon the oscillation characteristics of the crystal unit. Of course, the thickness of the crystal blank in the opposition region is set to a thickness such that the oscillation frequency that is produced in the opposition region has no adverse effect upon the oscillation characteristics in the vibration region, for example, the thickness being set to a thickness such that the frequency of the odd harmonics or overtone components of the oscillation frequency that is produced in the opposition region does not match the oscillation frequency in the vibration region.

In the present invention, the opposition region is preferably formed in the central portion separated from the peripheral portion in the crystal blank.

Each extending electrode preferably connects over the entire circumference of the corresponding excitation electrode, and the opposition region is preferably formed in a ring shape. The adoption of this configuration minimizes the conductive resistance between the excitation electrodes and extending electrodes, enables supply of electrical energy to the excitation electrodes from the entire circumference of the excitation electrodes, and enables the minimization of the crystal impedance.

In addition, in the present invention, each extending electrode is preferably led from the opposition region to an expanded region, and the thickness of the extending electrodes is preferably greater than that of the excitation electrodes. If this configuration is adopted and the cross-sectional area of the extending electrodes made large, the conductive resistance of the extending electrodes themselves can be reduced to a low level.

DETAILED DESCRIPTION OF THE PREFERRED EMBODIMENTS

Figure 4A:
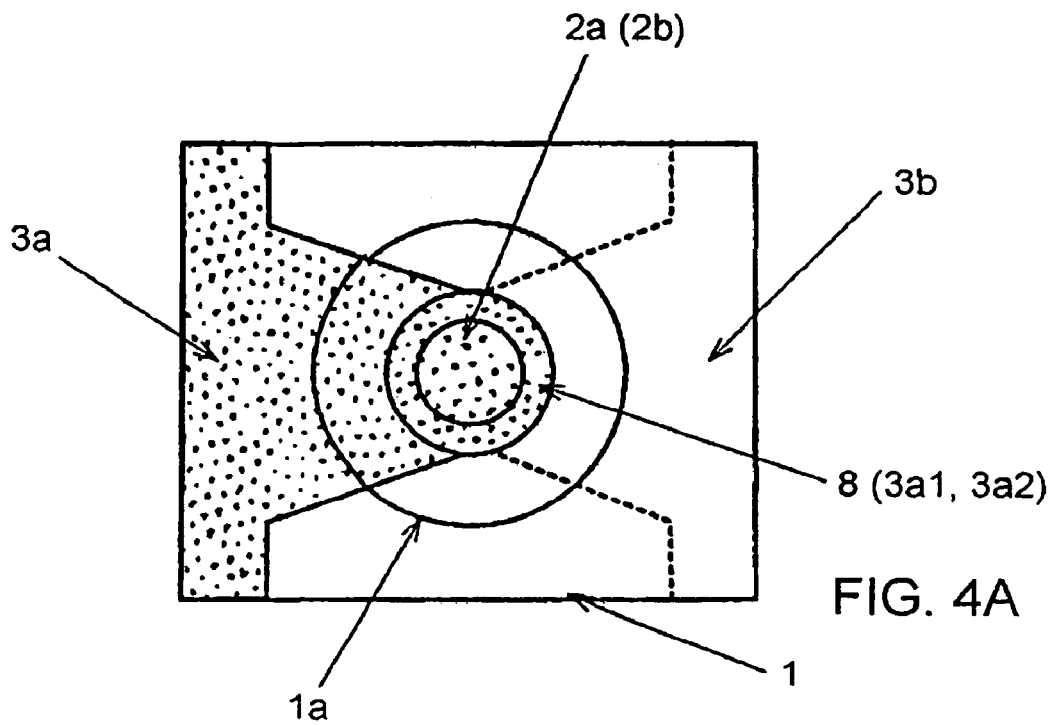
FIG. 4A is a plan view of a crystal blank used in a crystal unit according to an embodiment of the present invention.
Figure 4B:
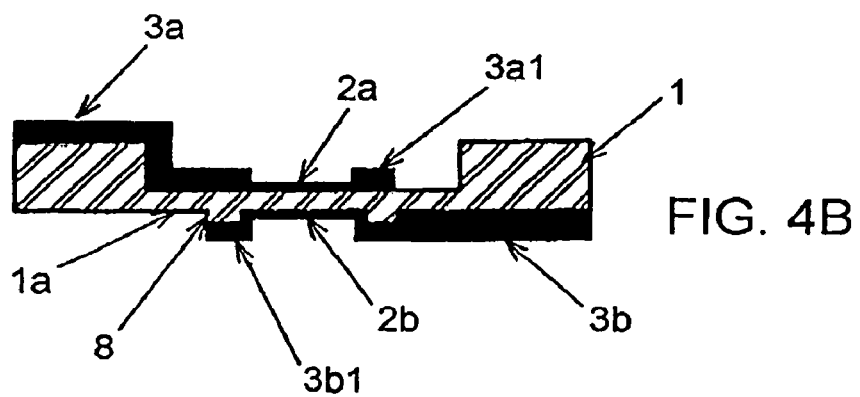
FIG. 4B is a sectional view of the crystal blank shown in FIG. 4A.
Figure 4C:
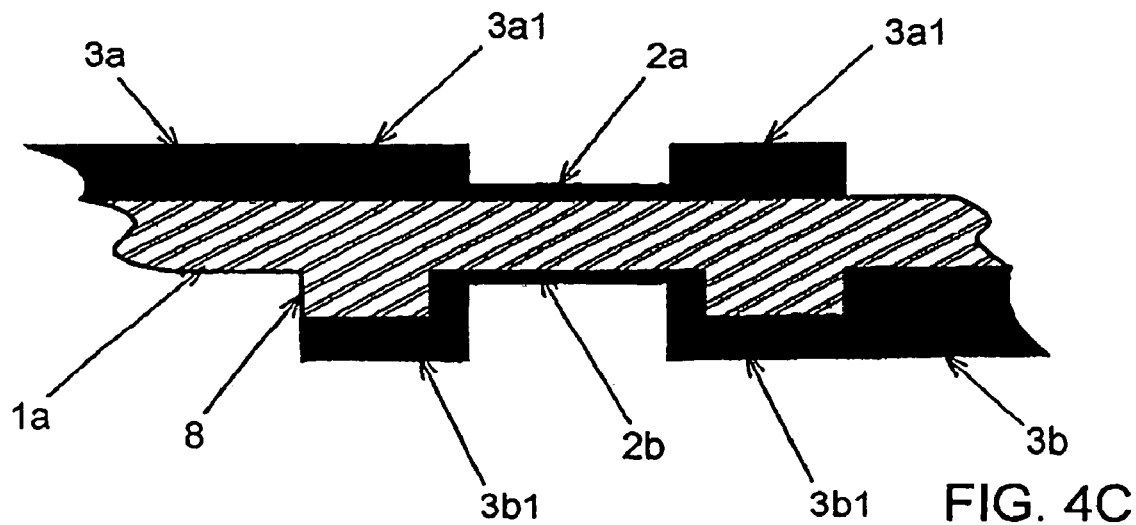
FIG. 4C is a partial enlargement of the sectional view of the vibration region of the crystal blank that is shown in FIG. 4A.

FIGS. 4A, 4B and 4C show a quartz crystal blank that is used in a quartz crystal unit to a preferable embodiment of the present invention. Further, components shown in FIGS. 4A, 4B, and 4C that are identical to constituent elements shown in FIGS. 1A, 1B, 2A, and 2B are given the same reference numerals, and redundant explanation regarding these components is here either simplified or omitted.

As previously explained, a crystal unit is composed of AT-cut rectangular crystal blank 1. Crystal blank 1 is composed of a relatively thin central portion that constitutes vibration region 1a and a relatively thick peripheral portion that encloses the outer circumference of the central portion. The central portion is formed by etching from one major surface of crystal blank 1 to provide a cylindrical depression. The bottom surface of the depression corresponds to vibration region 1a. A pair of substantially circular excitation electrodes 2a and 2b are formed on the both major surfaces of crystal blank 1 such that these excitation electrodes oppose each other with crystal blank interposed. Extending electrodes 3a and 3b are formed so as to extend from excitation electrodes 2a and 2b, respectively, toward the two ends of mutually opposite directions of the crystal blank. Extending electrodes 3a and 3b are formed on the both major surfaces of crystal blank 1, respectively.

In this crystal unit, the thickness of vibration region 1a is approximately 2.2 μm, the oscillation frequency is 622 MHz, the outer shape of crystal blank 1 is 1.4 mm×1.2 mm, the diameter of vibration region 1a is 0.5 mm, and the diameter of each of excitation electrodes 2a and 2b is 0.2 mm.

In addition, ring-shaped thick portion 8 is formed as a protrusion that is provided on crystal blank 1 around the entire outer circumference of excitation electrode 2b on the major surface of crystal blank 1 in which the above-described depression is not formed. Ring-shaped electrode portion 3b1 that contacts the entire outer circumference of excitation electrode 2b is formed as a portion of extending electrode 3b on the upper surface of thick portion 8. Further, ring-shaped electrode portion 3a1 that connects over the entire outer circumference of excitation electrode 2a is formed as a part of extending electrode 3a on the bottom surface of the depression of crystal blank 1 at positions that correspond to ring-shaped thick portion 8. The inner circumferences of extending electrodes 3a and 3b thus connect to the entire outer circumferences of excitation electrodes 2a and 2b, respectively. Thick portion 8 is formed by etching to remove portions other than the thick portion 8 from the major surface of crystal blank 1.

Obviously, extending electrodes 3a and 3b overlap each other with crystal blank 1 interposed in the area of thick portion 8, and this region of thick portion 8 is thus the opposition region in which the pair of extending electrodes overlap each other with crystal blank interposed.

Extending electrodes 3a and 3b are provided with regions that expand from each of the mutually opposed half-circumferences of ring-shaped electrode portions 3a1 and 3b1 of extending electrodes 3a and 3b and extend in opposite directions toward the two ends of crystal blank 1. The thickness of extending electrodes 3a and 3b, including the regions of ring-shaped electrode portions 3a1 and 3b1, is greater than the thickness of excitation electrodes 2a and 2b, and the electrical conductive resistance of the extending electrodes is therefore reduced to a low level.

Figure 1A:
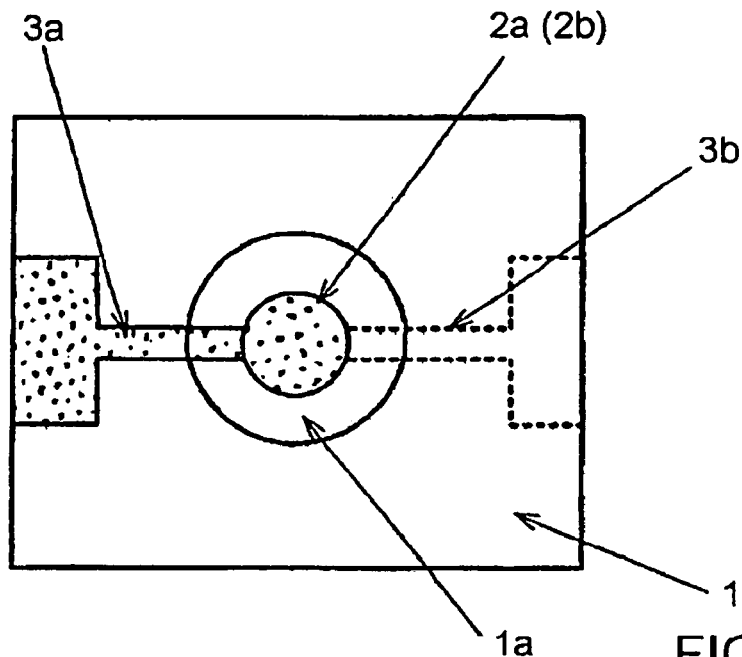
FIG. 1A is a plan view of a crystal blank used in crystal unit of the prior art.
Figure 1B:
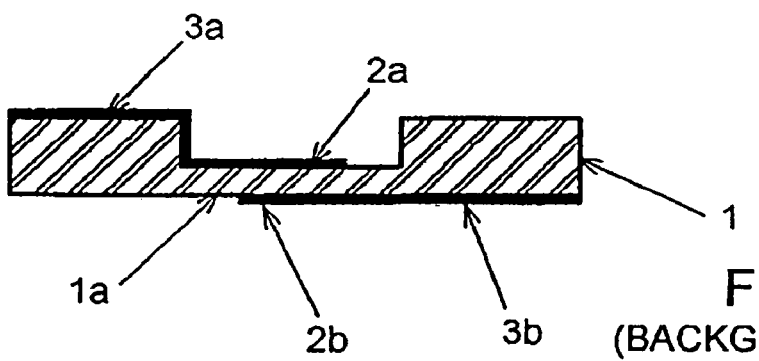
FIG. 1B is a sectional view of the crystal blank shown in FIG. 1A.
Figure 1C:
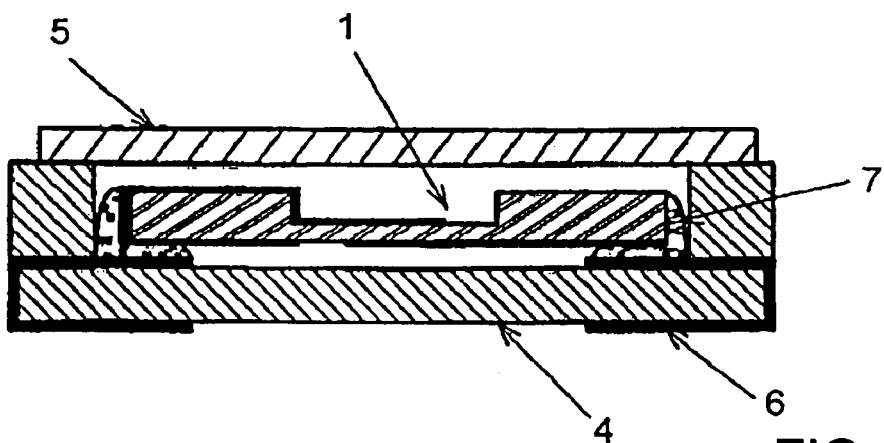
FIG. 1C is a sectional view of the crystal unit in which the crystal blank has been incorporated.
Figure 2A:
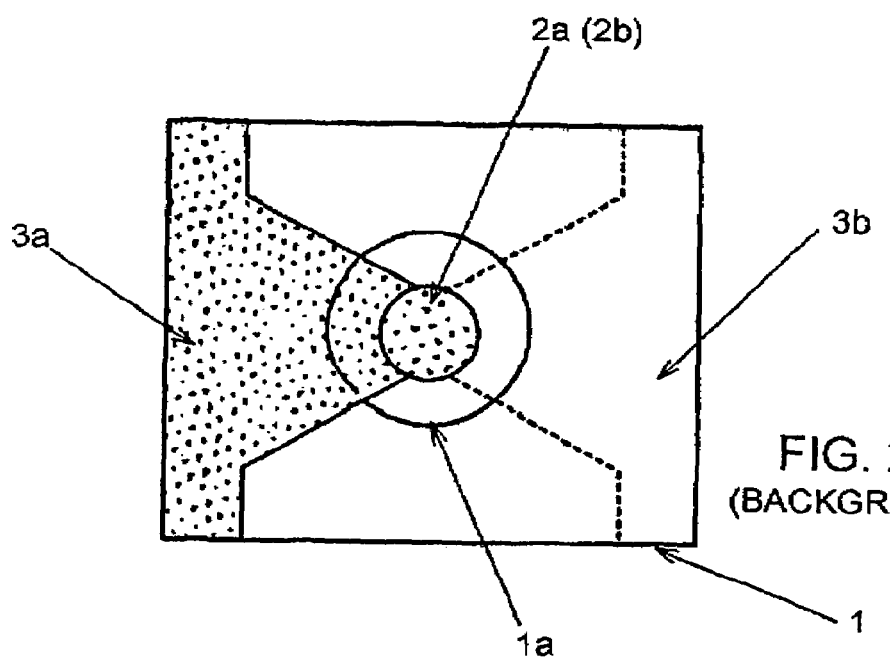
FIG. 2A is a plan view of the crystal blank used in another crystal unit of the prior art.
Figure 2B:
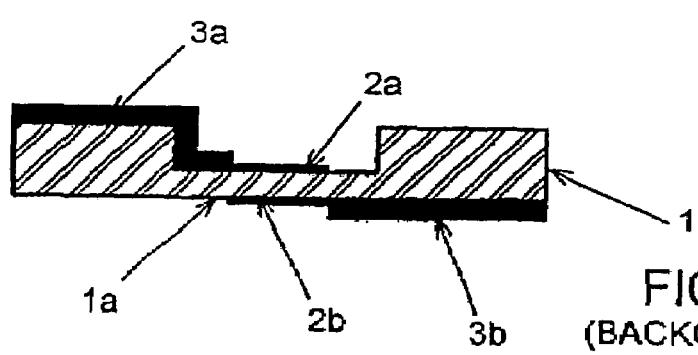
FIG. 2B is a sectional view of the crystal blank shown in FIG. 2A.
Figure 3:
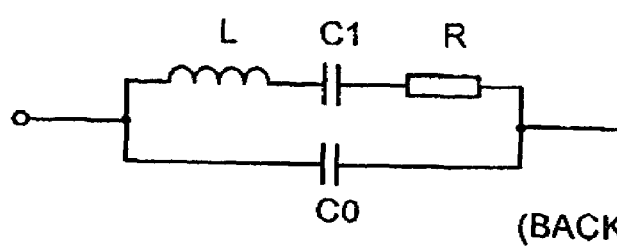
FIG. 3 is an equivalent circuit diagram of a crystal unit.

Crystal blank 1 of this configuration is then hermetically sealed within a receptacle for surface mounting as in the case shown in FIG. 1C, whereby the crystal unit is completed.

In the crystal unit of the present embodiment, extending electrodes 3a and 3b are connected by way of ring-shaped electrode portions 3a1 and 3b1 to excitation electrodes 2a and 2b, respectively, with the entire outer circumferences of the excitation electrodes as the connection regions. As a result, in this crystal unit, the conductive resistance between excitation electrodes 2a and 2b and extending electrodes 3a and 3b can be minimized and sufficient electrical energy can be supplied to the excitation electrodes from the entire outer circumferences. Accordingly, the crystal impedance of the crystal unit can be sufficiently reduced.

The portion in which ring-shaped electrode portions 3a1 and 3b1 of extending electrodes 3a and 3b are formed is realized as thick portion 8 and is thicker than vibration region 1a, and inter-electrode capacitance between ring-shaped electrode portions 3a1 and 3b1 is thus reduced to a low level. The equivalent parallel capacitance C0 of the crystal unit can accordingly be kept to a low level depending on the area of opposition between excitation electrodes 2a and 2b. On the other hand, because the substantial size of excitation electrodes 2a and 2b does not change, equivalent series capacitance C1 can be kept uniform. In this crystal unit, capacitance ratio γ (=C0/C1) can be reduced to a low level.

If the thickness of vibration region 1a in the crystal unit is 2.2 μm and the diameter of each of excitation electrodes 2a and 2b is 0.2 mm as previously described, the inter-electrode capacitance of the excitation electrodes is 0.5 pF. If it is further assumed that the electrode width on the top surface of thick portion 8 is 0.05 mm and the thickness of thick portion 8 is 20 μm, the total inter-electrode capacitance, which is the sum of the capacitance of the excitation electrode portion and the capacitance of the extending electrode portion, is approximately 0.53 pF. In other words, despite the existence of a region in which extending electrodes overlap each other with crystal blank 1 interposed, the present embodiment enables a reduction of the increase in the inter-electrode capacitance that is due to only the excitation electrodes.

In this case, the oscillation frequency that is caused by thick portion 8 is produced at a lower range than the oscillation frequency in vibration region 1*a* and therefore has no appreciable effect on the oscillation characteristics of the crystal unit. In this case, the thickness in thick portion 8 is set such that the odd harmonics or overtone components of the oscillation frequency in the thick portion differs from the oscillation frequency in vibration region 1*a*.

In the crystal unit according to the foregoing explanation, ring-shaped electrode portions 3*a*1 and 3*b*1 are formed to correspond to the entire circumference of ring-shaped thick portion 8, but as long as ring-shaped electrode portions 3*a*1 and 3*b*1 meet the condition that the region of mutual overlap be at least half of the outer circumferences of excitation electrodes, ring-shaped electrode portions 3*a*1 and 3*b*1 may be only partially formed corresponding to thick portion 8. In this case, regions will occur in ring-shaped thick portion 8 in which the pair of extending electrodes do not overlap, and in these regions, a thick portion need not be provided and the thickness of crystal blank 1 may be made the same thickness as the vibration region.

Although thick portion 8 was formed by providing a ring-shaped protruding portion on the surface in which the depression of crystal blank 1 is not formed, thick portion 8 may also be provided on the bottom surface of the depression, or alternatively, a thick portion may be provided on both surfaces of crystal blank 1.

When the above-described crystal blank is formed by etching from a single quartz crystal wafer, a considerable amount of etching is necessary to reduce the wafer to the thickness of vibration region 1*a*. However, the above-described crystal blank 1 may be prepared as disclosed in, for example, Japanese Patent Laid-Open Publication No. 2004-40693 (JP, P2004-40693A) wherein two quartz crystal plates, one quartz crystal plate corresponding to the vibration region and the other quartz crystal plate having a through-hole that corresponds to the vibration region, are adhered together by, for example, direct bonding.

What is claimed is:

1. A crystal unit, comprising:
   a crystal blank having central portion that is used as a vibration region and a peripheral portion that encloses said central portion and that is provided with greater thickness than said central portion;
   a pair of excitation electrodes provided respectively on both major surface of said crystal blank in said vibration region;
   a pair of extending electrodes led out from said pair of excitation electrodes toward ends of said crystal blank, respectively; and
   an opposition region in which said pair of extending electrodes overlap with said crystal blank interposed;
   wherein each of said extending electrodes connects to a corresponding said excitation electrode over at least one half of an outer circumference of said excitation electrode; and a thickness of said crystal blank in said opposition region is greater than a thickness of said crystal blank in said vibration region.

2. The crystal unit according to claim 1, wherein said opposition region is formed inside said central portion and separated from said peripheral portion.

3. The crystal unit according to claim 2, wherein each of said excitation electrodes is formed in a circular shape.

4. The crystal unit according to claim 3, wherein each of said extending electrodes connects over entire outer circumference of a corresponding excitation electrode, and said opposition region is formed in a ring shape.

5. The crystal unit according to claim 1, wherein each said extending electrode is led from said opposition region by an expanding region.

6. The crystal unit according to claim 5, wherein a thickness of said extending electrodes is greater than a thickness of said excitation electrodes.

7. The crystal unit according to claim 1, wherein said crystal blank is an AT-cut crystal blank.

* * * * *